United States Patent
Lo et al.

(10) Patent No.: US 9,274,410 B2
(45) Date of Patent: Mar. 1, 2016

(54) METHOD AND SYSTEM FOR AUTOMATED GENERATION OF MASKS FOR SPACER FORMATION FROM A DESIRED FINAL WAFER PATTERN

(75) Inventors: Wai Lo, Palo Alto, CA (US); Todd Lukanc, San Jose, CA (US); Christie Marrian, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 271 days.

(21) Appl. No.: 12/701,391

(22) Filed: Feb. 5, 2010

(65) Prior Publication Data

US 2011/0195348 A1 Aug. 11, 2011

(51) Int. Cl.
*G06F 17/50* (2006.01)
*G03F 1/00* (2012.01)

(52) U.S. Cl.
CPC ...................... *G03F 1/14* (2013.01)

(58) Field of Classification Search
USPC .......................................................... 716/55
See application file for complete search history.

(56) References Cited

U.S. PATENT DOCUMENTS

| | | | | |
|---|---|---|---|---|
| 4,685,194 A | * | 8/1987 | Cricchi et al. | 438/294 |
| 5,620,931 A | * | 4/1997 | Tsang et al. | 438/50 |
| 6,096,458 A | * | 8/2000 | Hibbs | 430/5 |
| 6,153,342 A | * | 11/2000 | Doyle et al. | 430/5 |
| 2005/0049839 A1 | * | 3/2005 | Stanton | 703/2 |
| 2010/0009270 A1 | * | 1/2010 | Thiele | 430/5 |
| 2010/0183958 A1 | * | 7/2010 | Inaba | 430/5 |

* cited by examiner

*Primary Examiner* — Paul Dinh
*Assistant Examiner* — Bryce Aisaka (57) ABSTRACT

Methods and systems for generating masks for spacer formation are disclosed. As a part of a disclosed method, a predefined final wafer pattern is accessed, areas related to features in the predefined final wafer pattern are identified and a template mask is formed based on the identified areas for forming spacers on a wafer. Subsequently, a mask is formed for use in the removal of portions of the spacers to form an on wafer pattern that corresponds to the predefined final wafer pattern.

12 Claims, 12 Drawing Sheets

METHOD AND SYSTEM FOR AUTOMATED GENERATION OF MASKS FOR SPACER FORMATION FROM A DESIRED FINAL WAFER PATTERN

FIELD OF THE INVENTION

The present invention relates to the generation of template masks for forming spacers on a semiconductor wafer.

BACKGROUND

Photolithography is a process used in the fabrication of microelectronic devices and circuitry to selectively remove parts of a thin film or the bulk of a substrate. Photolithographic patterning tools use light to transfer a geometric pattern from a photo or template mask to light-sensitive photo resist located on the substrate. Thereafter, chemical processes may be used to engrave the resultant exposure pattern into the material underneath the photo resist.

Photolithographic patterning tools have inherent pitch patterning limitations as regards the patterning of lines and spaces. Consequently, as technologies move to smaller pitches, the pitches, employed in the implementation of such technologies, move beyond the patterning capability of existing patterning tools. Indirect patterning techniques are used to achieve pitches beyond the patterning capability of conventional patterning tools.

A conventional indirect patterning technique utilizes spacers to define lines and spaces in a wafer pattern. In this approach, the pitch of features of the template layer that define the location of the spacers are twice the final pitch of features of the final pattern and thus allows the final pattern to include features that are as much as half the minimum patterning pitch. A shortcoming of this approach is that in contrast to direct patterning approaches, the template mask image does not represent the final pattern and thus conventional layout verification tools can not be used to verify proper layout and hookup.

In addition, such approaches require the drawing of both a template layer pattern and a desired final wafer pattern. Because the technician is required to manually draw a template layer pattern as well as the desired final wafer pattern, the likelihood that wafer pattern errors will result is increased. This is especially true for wafer pattern errors that are not obvious from an inspection of the template pattern. Moreover, drawing both a template layer pattern and a desired final wafer pattern involves much more than double the work that is required where only the drawing of the template layer pattern is involved.

It should be appreciated that template layer work is not intuitive to a layout engineer and requires a detailed knowledge of patterning technology. Such knowledge is generally within the domain of the process technologist who typically does not possess the skill set of the layout engineer. Therefore, where conventional approaches are used, the artisans involved in the implementation of a design require additional training. The additional time that is required to train artisans involved in the design implementation process causes design flow delays. Accordingly, conventional approaches are inefficient and error prone and involve design flow delays that add to the cost and complexity of the manufacturing process.

SUMMARY OF THE INVENTION

Methods and systems for generating masks for spacer formation are disclosed. As a part of a disclosed method, a predefined final wafer pattern is accessed, areas related to features in the predefined final wafer pattern are identified and a template mask is formed based on the identified areas for forming spacers on a wafer. Subsequently, a mask is formed for use in the removal of portions of the spacers to form an on wafer pattern that corresponds to the predefined final wafer pattern.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 1:
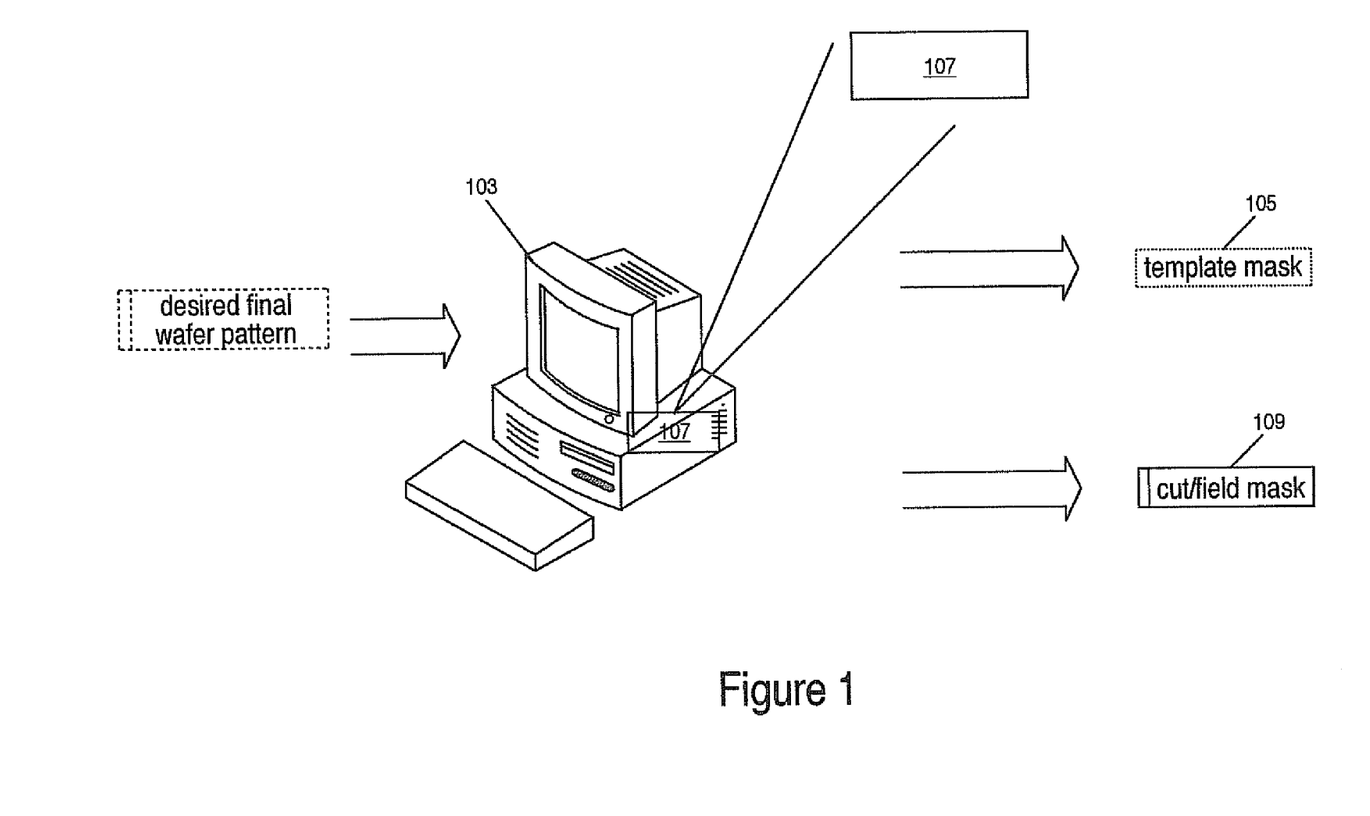
FIG. 1 shows an exemplary computer system operating environment of a system for automated generation of masks for use in the formation of spacers on a wafer according to one embodiment of the present invention.

Exemplary Computer System Operating Environment for a System for Automated Generation of Masks for Spacer Formation from a Desired Final Wafer Pattern According to One Embodiment FIG. 1 shows an exemplary computer system operating environment of a system 107 for automated generation of masks for spacer formation from a desired final wafer pattern according to one embodiment. In one embodiment, system 107 is a computer program that executes on a computer system 103 and uses a desired final wafer pattern that is provided by a system user, to generate masks that are used to form spacers from which an actual final "on wafer" pattern is formed that corresponds to the originally drawn desired final wafer pattern. This automated process enables straightforward and accurate verification operations. Moreover, system 107 allows system users to apply the same pattern drawing skills that they use to prepare drawings for direct patterning processes to double patterning processes. Thus, for example, a layout engineer can prepare drawings for a double patterning process without knowledge of indirect patterning techniques that are typically utilized as a part of conventional double patterning processes. Accordingly, design flow delays typical of conventional approaches are avoided which results in a more efficient design flow process that reduces manufacturing cost. The spacers that are formed may be used to form lines and spaces that have a patterning pitch that is less than the minimum patterning pitch that is obtainable by direct patterning methodologies. FIG. 1 shows desired final wafer pattern 101, computer system 103, template mask 105, cut/field mask 109 and system 107.

Referring to FIG. 1, to initiate the mask generation process, a prepared drawing of a desired final wafer pattern is input to system 107. In one embodiment, the prepared drawing can be input to system 107 via a graphical user interface that may be associated with system 107. In one embodiment, the drawing of the desired final wafer pattern 101 that is input into system 107 may be split into two layers in order to facilitate verification that the actual final "on wafer" pattern is proper (see discussion below). In one embodiment, the desired final wafer pattern 101 may be split into two layers by a system user, e.g., a layout engineer etc., prior to input into system 107. The drawing that is input to system 107 may be used to generate template mask 105, a cut mask or a field mask 109 and other supporting layers (mask components that support the formation of the actual final "on wafer" pattern that is used to form lines or spaces on a wafer). A detailed description of the operation of system 107 is provided below in the following section entitled OPERATION.

In one embodiment, system 107 can be a part of another software or hardware system that executes on computer system 103, such as a layout tool (not shown in FIG. 1) or can be separate from such software or hardware system and operate cooperatively therewith. In one embodiment, system 107 can be implemented in hardware, software are in a combination both.

Operation

Figure 2:
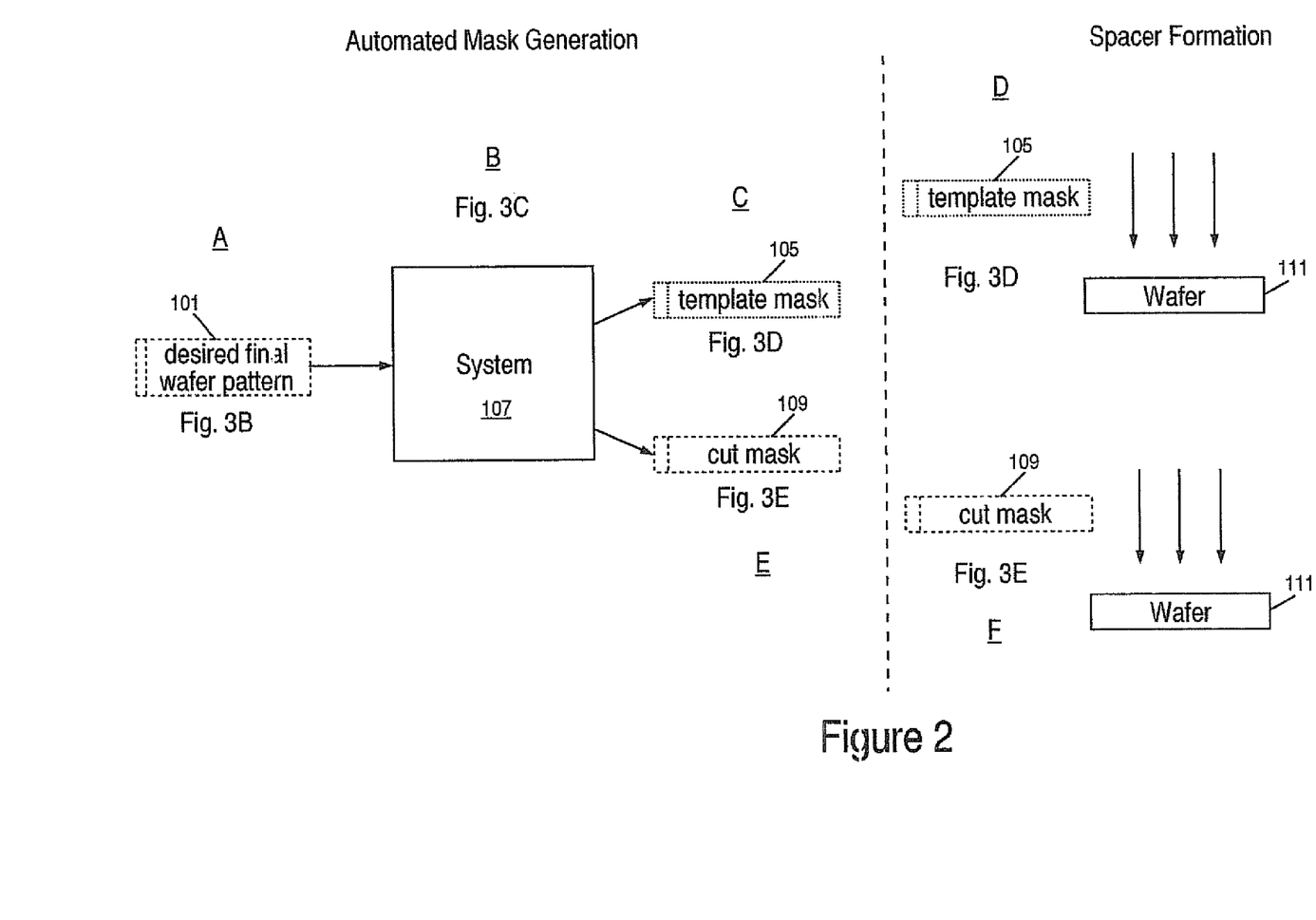
FIG. 2 illustrates operations A-F performed in a process for generating a template mask, a cut mask or a field mask and other supporting layers for use in the formation of spacers on a wafer according to one embodiment of the present invention.

FIG. 2 illustrates operations A-F performed in a process for generating a template mask, a cut mask or a field mask and other supporting layers for use in the formation of spacers on a wafer such as discussed above. In the FIG. 2 embodiment, the spacers may be used to define lines, such as may be used in the fabrication of a polysilicon wordline layer in a high density NAND flash design. These operations including the order in which they are presented are only exemplary. In other embodiments, other operations in other orders may be used. FIGS. 3A-3F show an exemplary desired final wafer pattern, mask patterns, spacers and actual final "on wafer" pattern that correspond to respective operations A-F illustrated in FIG. 2. The operations that are illustrated in FIG. 2 are described below in conjunction with its corresponding desired final wafer pattern, mask patterns, spacers and actual final "on wafer" pattern that is shown in FIGS. 3A-3F.

Line Formation

Figure 3A:
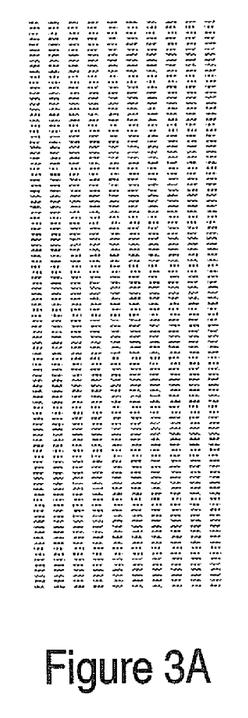
FIG. 3A shows an originally drawn desired final wafer pattern according to one embodiment of the present invention.
Figure 3B:
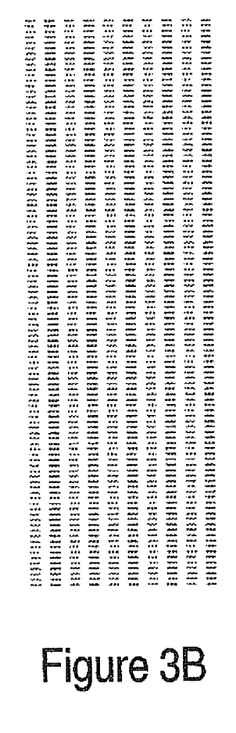
FIG. 3B shows a desired final wafer pattern that has been separated into a plurality of levels according to one embodiment of the present invention.

Referring to FIG. 2, at A, a desired final wafer pattern, such as that shown in FIG. 3A, that is separated into a plurality of layers, such as is shown in FIG. 3B is accessed by system 107. In FIG. 3B darker shaded lines "a" represent a first layer of the plurality of layers and lighter shaded lines "b" represent a second layer of the plurality of layers. As discussed above, in one embodiment, the final wafer pattern may be prepared and supplied by a system user such as a layout engineer. In one embodiment, the drawn final wafer pattern is separated into a plurality of layers in order to facilitate verification that its layout is proper.

It should be appreciated that FIG. 3A illustrates the case where a desired final wafer pattern is a series of parallel lines which are spaced so closely together that conventional patterning (direct patterning) may not be possible. In the FIG. 3A embodiment the traces of the desired final wafer pattern are drawn to be separated by the minimum patterning pitch and as discussed above are alternated between two layers. In one embodiment, a pitch restriction for the two layers provides that the distance between traces "a" be greater than or equal to the minimum patterning space, the distance between traces "b" be greater than or equal to the minimum patterning space and the distance between "a" and "b" be either a new minimum drawn space or be greater than or equal to the minimum patterning space. In one embodiment, other rules related to layout design may be employed, e.g., at the minimum pitch each feature "a" must be adjacent to a feature "b".

In one embodiment, the rules can be implemented through logic/boolean based operations performed as a part of the execution of a computer program (e.g., an application program) such as is embodied by system 107. In one embodiment, as discussed above system 107 can be a part of a layout tool that makes the operations transparent to the layout engineer. In exemplary embodiments, the computer program enables the layout engineer to perform tasks with minimal delay.

Figure 3C:
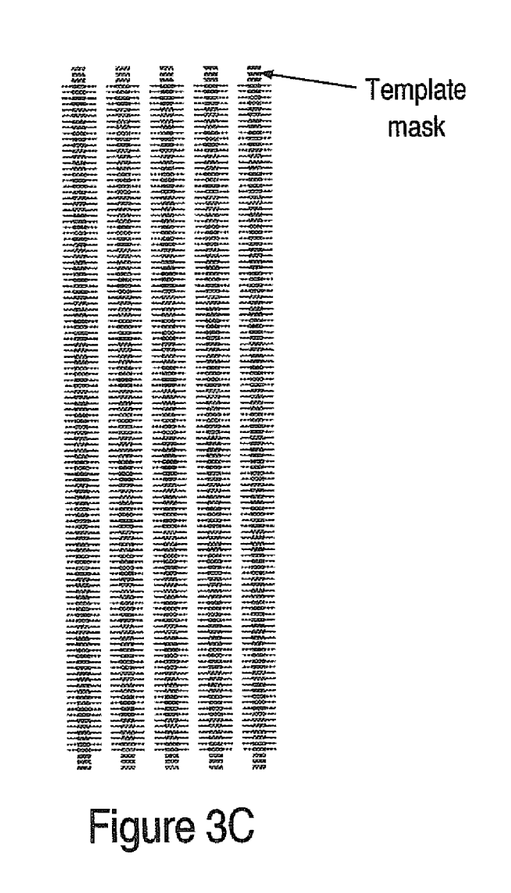
FIG. 3C illustrates an operation performed in the process of generating a template mask based on a desired final wafer pattern according to one embodiment of the present invention.

In FIG. 2, at B, spaces are identified between features of the plurality of layers of the desired final wafer pattern. FIG. 3C shows how spaces may be identified between features of the plurality of layers of the desired final wafer pattern according to one embodiment.

In the FIG. 3C example, the spaces that are identified include every other drawn space in the minimum pitch areas. Moreover, in the FIG. 3C example, the identified spaces are places that have a feature "a" to its right, and a feature "b" to its left. It should be appreciated that this space identification scheme could be reversed (the identified spaces can have a feature "a" to its left and a feature "b" to its right). In exemplary embodiments, the space identification scheme should be consistent over the entire template mask.

Figure 3D:
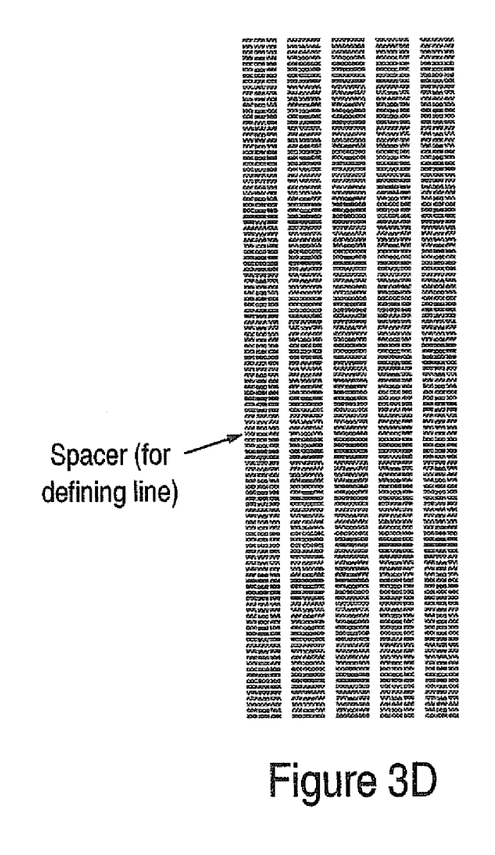
FIG. 3D shows spacers formed using a template mask generated based on a desired final wafer pattern according to one embodiment of the present invention.

In FIG. 2, at C, a template mask is formed based on the spaces that are identified at B. The template mask is generated for use in patterning the wafer. At D, the template pattern is formed on wafer 111 using the template mask formed at C. FIG. 3D shows how spacers may be formed around the pattern that is formed on the wafer utilizing the generated template mask according to one embodiment. In one embodiment, adjacent features that are defined by the spacer may be connected together at the top and bottom of the pattern as is shown in FIG. 3D. In one embodiment, portions of the spacer that may connect adjacent features of the spacer at top and at bottom may be removed using a cut mask.

In FIG. 2, at E, a cut mask is formed. The cut mask is used to remove the portions of the spacer that connect the adjacent features of the spacer at top and at bottom. In one embodiment, the cut mask allows portions of the spacers that do not correspond to features of the spacers that are defined in the originally drawn desired final wafer pattern to be removed.

In FIG. 2, at F, a spacer that has an actual final "on wafer" pattern is formed by use of the cut mask to facilitate the removal of unwanted portions of the spacer. In one embodiment, the actual final "on wafer" pattern is the same as the originally drawn desired final wafer pattern of FIG. 3A.

Space Formation

Figure 4:
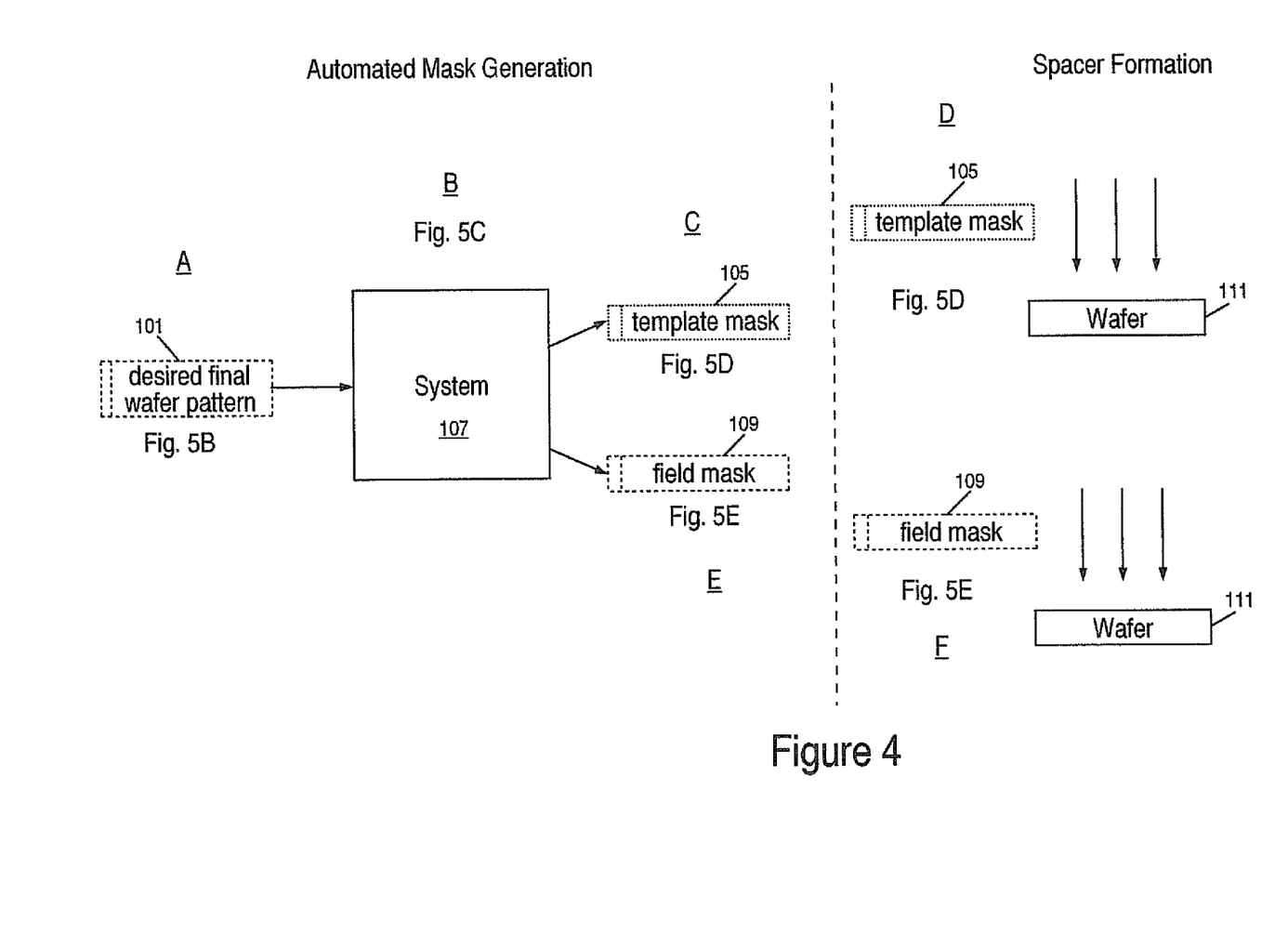
FIG. 4 illustrates operations A-F performed in a process for forming spacers that define spaces such as for a metal layer that are a part of a high density NAND flash design according to one embodiment of the present invention.

FIG. 4 illustrates operations A-F performed in a process for generating a template mask, a field mask and other supporting layers for use in the formation of spacers on a wafer such as discussed above. In the FIG. 4 embodiment, the spacers may be used to define spaces, such as may be used in the formation of a metal one layer in a high density NAND flash design. These operations including the order in which they are presented are only exemplary. In other embodiments, other operations in other orders may be used. FIGS. 5A-5F show an exemplary desired final wafer pattern, mask patterns, spacers or actual final "on wafer" pattern that correspond to respective operations A-F illustrated in FIG. 4. The operations that are illustrated in FIG. 4 are described below in conjunction with its corresponding desired final wafer pattern, mask patterns, spacers or actual final "on wafer" pattern that is shown in FIGS. 5A-5F.

Figure 5A:
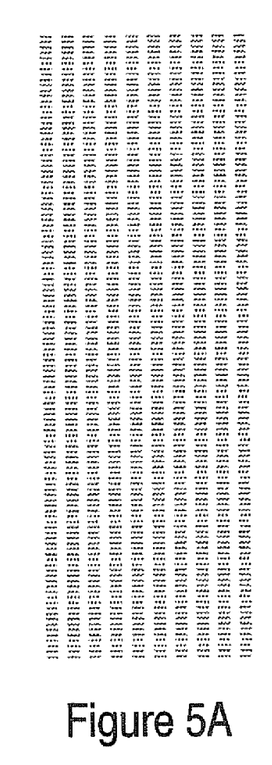
FIG. 5A shows an originally drawn final wafer pattern according to one embodiment of the present invention.
Figure 5B:
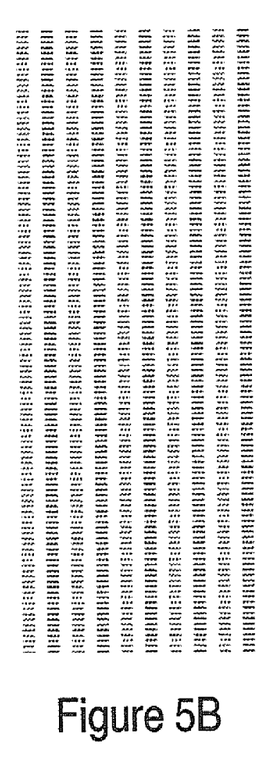
FIG. 5B shows an originally drawn final wafer pattern that has been separated into a plurality of levels according to one embodiment of the present invention.

Referring to FIG. 4, at A, a desired final wafer pattern, such as that shown in FIG. 5A, that is separated into a plurality of layers, such as is shown in FIG. 5B is accessed by system 107. In FIG. 5B lighter shaded lines are associated with a first layer of the aforementioned plurality of layers and darker shaded lines are associated with a second layer of the plurality of layers. As discussed above, in one embodiment, the desired final wafer pattern may be supplied by a system user such as a layout engineer. In one embodiment, the desired final wafer pattern is separated into a plurality of layers in order to facilitate proper layout verification.

Figure 5C:
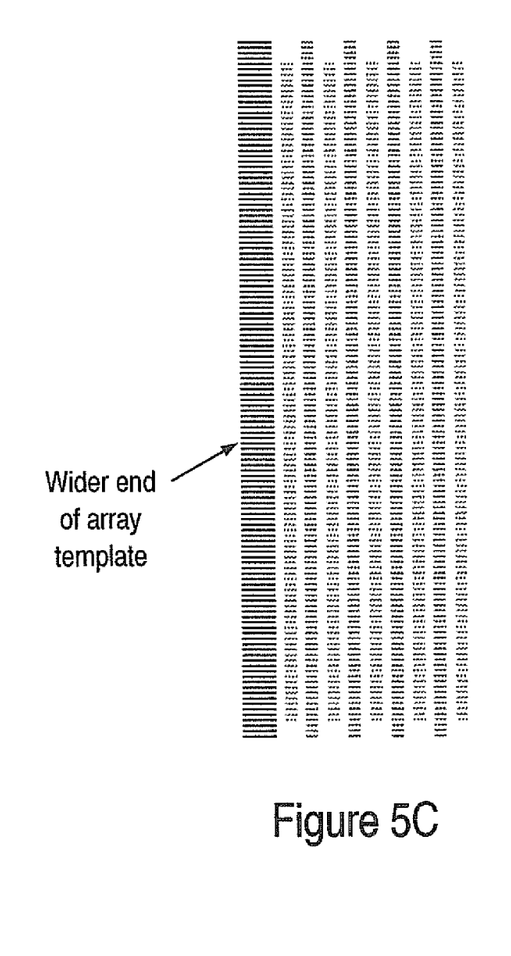
FIG. 5C illustrates an operation performed in the process of generating a template mask that is based on a desired final wafer pattern according to one embodiment of the present invention.

In FIG. 4, at B, every other line among lines of the desired final wafer pattern is identified through operation of system 107. FIG. 5C provides an example of the manner in which lines may be identified from among the lines of the final wafer pattern.

In FIG. 4, at C, based on the identified lines, a template mask is formed (see indicated lines of FIG. 5C).

Figure 5D:
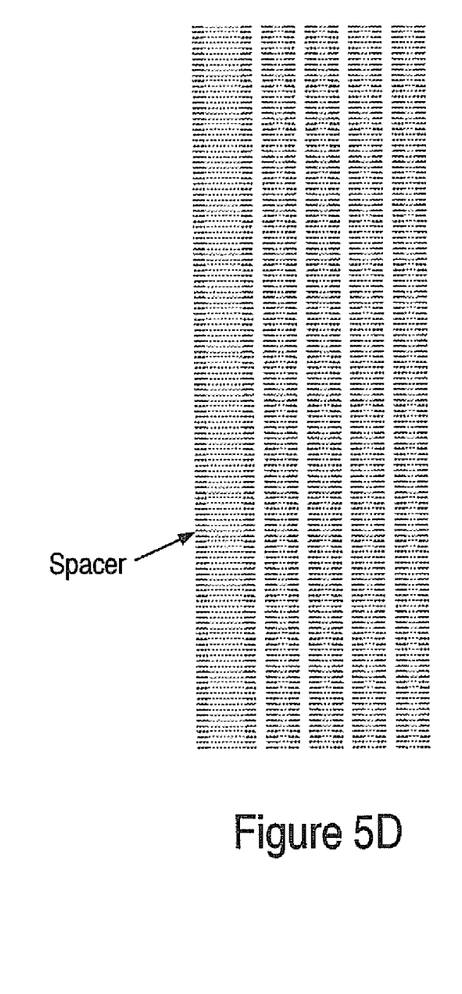
FIG. 5D shows spacers formed using a template mask that is generated from a desired final wafer pattern according to one embodiment of the present invention.

In FIG. 4, at D, a pattern is formed on wafer 111 using the template mask formed at C. FIG. 5D shows how spacers may be formed around the pattern on the wafer that is formed using the template mask according to one embodiment.

Figure 5E:
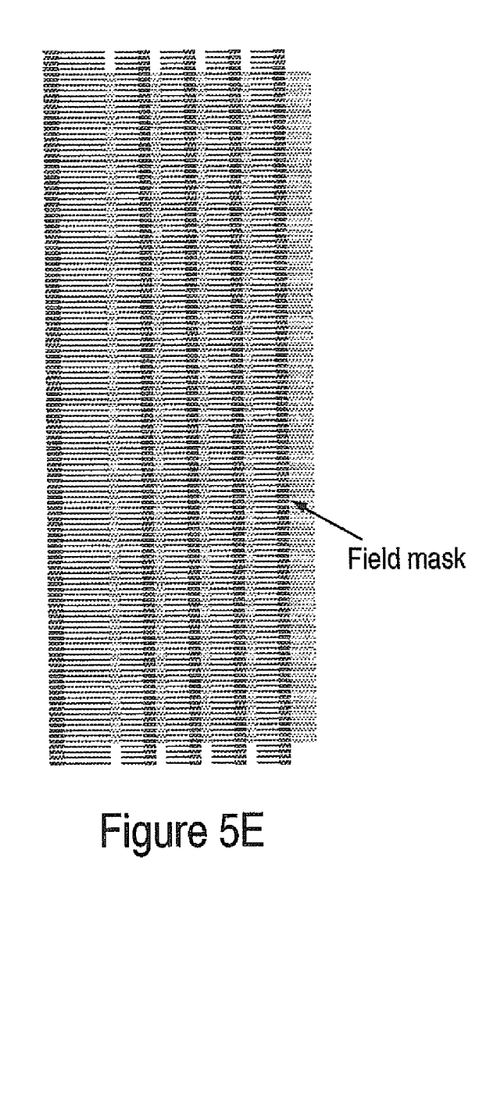
FIG. 5E shows a field mask applied to facilitate removal of portions of spacers according to one embodiment of the present invention.

In FIG. 4, at E, a field mask 109 is formed through operation of system 107. FIG. 5E shows an exemplary field mask that is positioned to facilitate removal of unwanted portions of the spacers according to one embodiment.

Figure 5F:
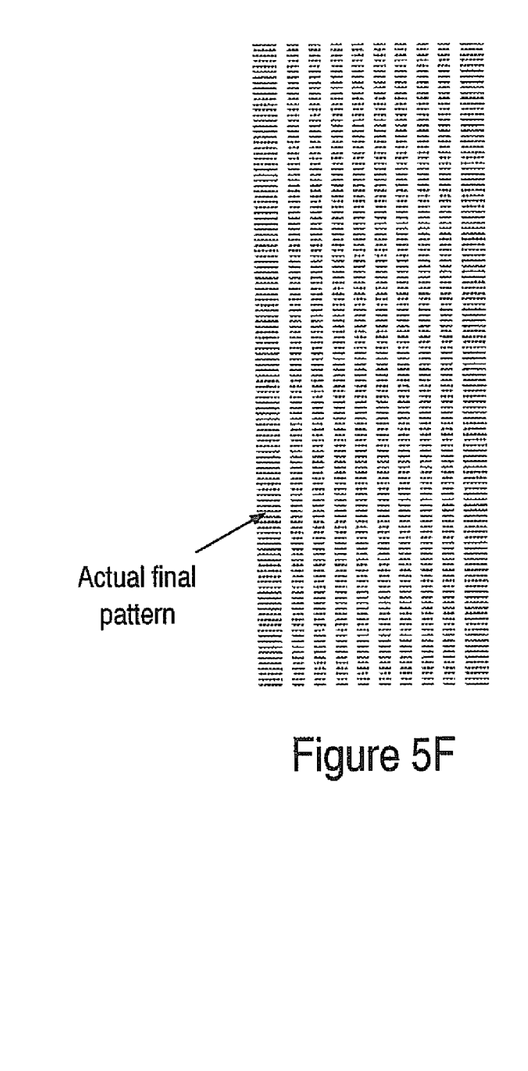
FIG. 5F shows an actual final "on wafer" pattern that is formed to correspond to a desired final wafer pattern according to one embodiment of the present invention.

In FIG. 4, at F, a spacer that has an actual final "on wafer" pattern is formed on wafer 111 using the field mask, formed at E which facilitates the removal of unwanted portions of the spacer (see FIG. 5F). In the process described with reference to FIG. 4, there may be some differences between the actual final "on wafer" pattern and the originally drawn desired final wafer pattern. In one embodiment, such differences should only involve the end lines of the array of dense lines and is a hallmark of space design using spacer based double patterning approaches (see FIG. 5F).

Figure 3E:
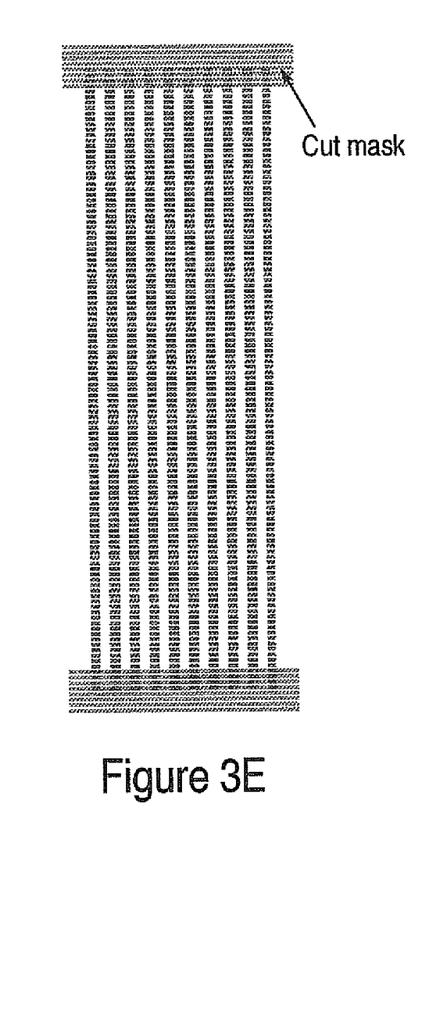
FIG. 3E shows the application of a cut mask to spacers formed using a template mask according to one embodiment of the present invention.
Figure 3F:
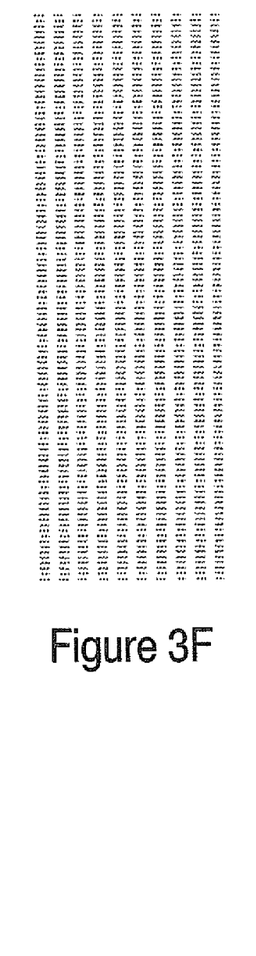
FIG. 3F shows an actual final "on wafer" pattern formed to correspond to a desired final wafer pattern according to one embodiment of the present invention.

In one embodiment, an important function of the code upon which the above discussed operations are based is its definition of the spacer regions to be outside the minimum pitch areas such that the spacers are continuous but are able to be removed in subsequent patterning and processing operations. In one embodiment, for spacer space layers, the spacer may be routed into the field regions and covered by a "field mask" (FIG. 5E). In one embodiment, for spacer line layers, the spacer may be routed out of an array such that a subsequent process step may remove those spacer regions (for example using a cut mask as shown in FIG. 3E).

In one embodiment, minimum pitch spacers and wider pitch polygons can be integrated such that they may be continuous on the wafer image. This may be done in spacer space layers by generating a "cut mask" (e.g., 109 in FIG. 4) to break the spacer when narrow lines connect to wider lines drawn on the same or different layers. It should be appreciated that in spacer line layers, embodiments may be configured to generate sufficient overlap of the spacer onto the wider lines to account for patterning and process variations.

Through the operations described above, system 107 generates masks that can be used for double patterning in such a manner that a layout engineer does not need to be familiar with the details of spacer based double patterning. In one embodiment, system 107 verifies that the generated templates and other supporting layers meet both mask and process minimum line/space layout rules. Moreover, in one embodiment system 107 may include a verification component that verifies that the actual final "on wafer" pattern matches the originally drawn desired final wafer pattern and also meets minimum process design rules for line, space, proximity, and overlap to itself and any or all other layers as specified in the technology layout design rules. In addition, in one embodiment, system 107 may report back any violations of the originally drawn desired final wafer pattern, layers that the system generates or the derived final "on wafer" pattern in standard design rule check format. The feedback can be used to update the originally drawn desired final wafer pattern such that the rules are no longer violated.

Figure 6:
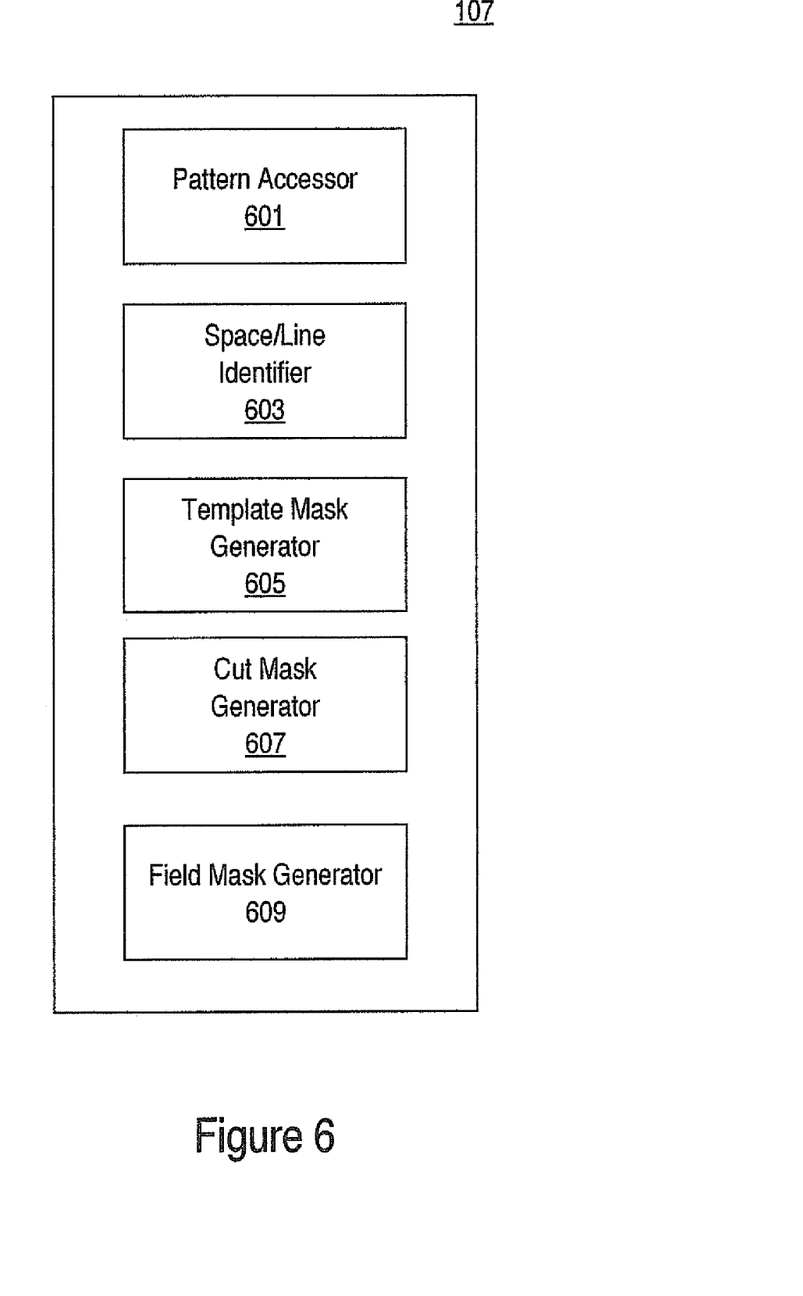
FIG. 6 shows components of a system for automated generation of masks for spacer formation from a desired final wafer pattern according to one embodiment of the present invention.

Components of System for Automated Generation of Masks for Spacer Formation from a Desired Final Wafer Pattern According to One Embodiment FIG. 6 shows components of system 107 for automated generation of masks for spacer formation from a final wafer pattern according to one embodiment of the invention. In the FIG. 6 embodiment, system 107 includes pattern accessor 601, space/line identifier 603, template mask generator 605, cut mask generator 607 and field mask generator 609. As discussed previously herein components of system 107 can be implemented in hardware or software or in a combination of both. In one embodiment, components and operations of system 107 can be encompassed by components and operations of a larger computer program, e.g., a layout tool that executes on a computer system. In another embodiment, components and operations of system 107 can be separate from the aforementioned larger computer program but can operate cooperatively with components and operations thereof.

Pattern accessor 601 accesses the desired final wafer pattern. As discussed herein, in one embodiment features of the desired final wafer pattern that is accessed by pattern accessor 601 may be separated so as to lie on a plurality of layers.

Space/line identifier 603 identifies lines or spaces in the desired final wafer pattern upon which a template mask pattern is based. In one embodiment, for spacer line formation, spaces are identified between features of the separated plurality of layers of the desired final wafer pattern provided by a system user (e.g., layout engineer, etc.). Moreover, in one embodiment, for spacer space formation, every other drawn line in the minimum pitch areas of the separated plurality of layers of the desired final wafer pattern that is provided by a system user is identified.

Template mask generator 605 forms a template mask from the originally drawn desired final wafer pattern based on the spaces or lines that are identified by space/line identifier 603. This is illustrated herein in FIGS. 3C and 5C.

Cut mask generator 607 forms a cut mask for cutting the spacers. In one embodiment the cut mask that is formed by cut mask generator 607 facilitates the removal of portions of the spacers so as to form spacers that assume a final "on wafer" pattern. In one embodiment the portions of the spacers that connect adjacent features at top and at bottom may be removed. In one embodiment, the cut mask allows portions of the spacers that do not correspond to features of the pattern that are defined in the originally drawn desired final wafer pattern to be removed.

Field mask generator 609 forms a field mask for spacers used to define spaces. The field masks facilitates the removal of portions of the spacers so as to form spacers that assume a final "on wafer" pattern. As discussed herein with reference to FIG. 5F, there may be some differences between the actual final "on wafer" pattern and the originally drawn desired final wafer pattern. In one embodiment, as discussed previously, such differences should only involve the end lines of the array of dense lines and is a hallmark of space design using spacer based double patterning approaches (see FIG. 5F).

Figure 7:
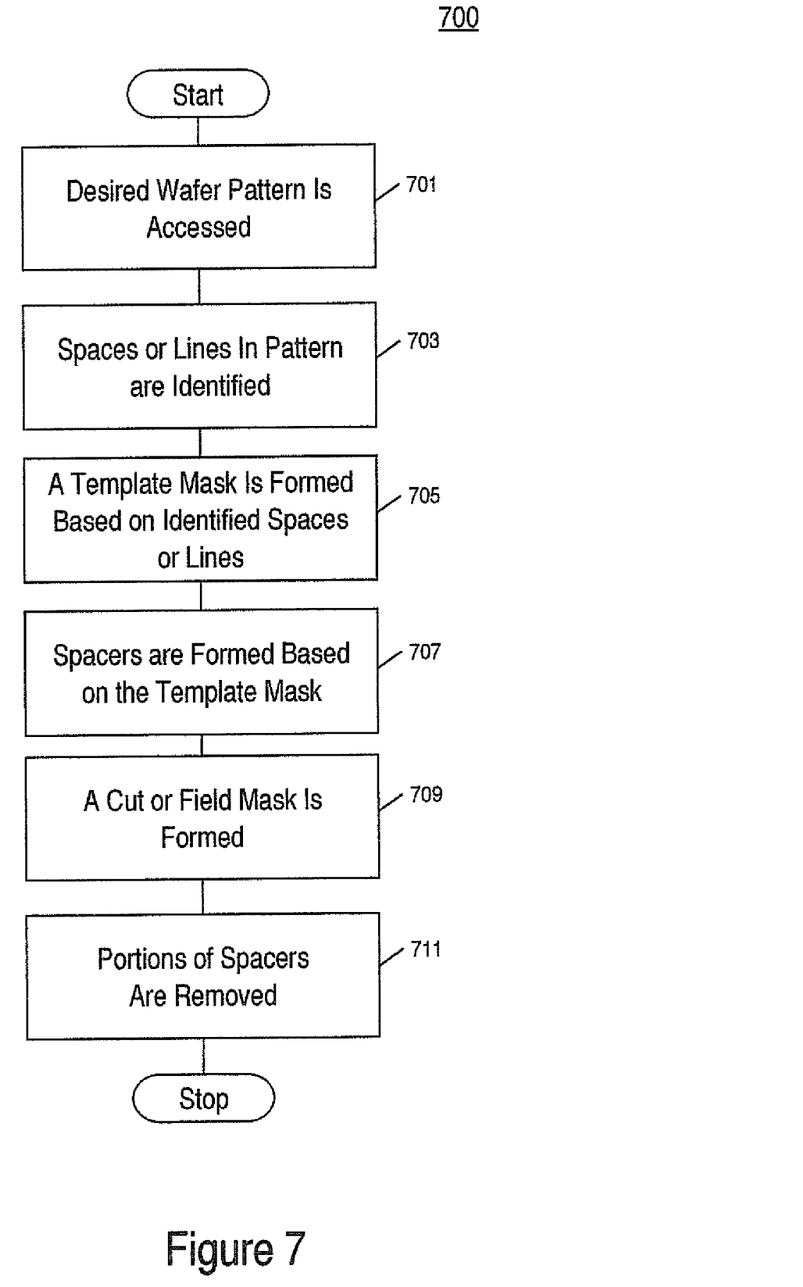
FIG. 7 shows a flowchart of the steps performed in a method for automated generation of masks for spacer formation from a desired final wafer pattern according to one embodiment of the present invention.

Exemplary Flowchart of Method for Automated Generation of Masks for Spacer Formation from a Desired Final Wafer Pattern According to One Embodiment FIG. 7 shows a flowchart 700 of the steps performed in a method for automated generation of masks for spacer formation from a desired final wafer pattern according to one embodiment. The flowchart includes processes that, in one embodiment can be carried out by processors and electrical components under the control of computer-readable and computer-executable instructions. Although specific steps are disclosed in the flowcharts, such steps are exemplary. That is the present invention is well suited to performing various other steps or variations of the steps recited in the flowcharts. Within various embodiments, it should be appreciated that the steps of the flowcharts can be performed by software, by hardware or by a combination of both.

Referring to FIG. 7, at step 701, a desired final wafer pattern is accessed. As described herein the desired final wafer pattern may be the intended final wafer pattern which may be provided by a system user such as a layout engineer. At step 703, spaces or lines in the desired final wafer pattern are identified. At step 705, a template mask is formed based on the identified spaces or lines. At step 707, spacers are formed based on the template mask. At step 709, a cut or field mask is formed for facilitating the removal of portions of the spacers. At step 711, portions of the spacers are removed in order to form spacers that correspond to the desired final wafer pattern.

Figure 8:
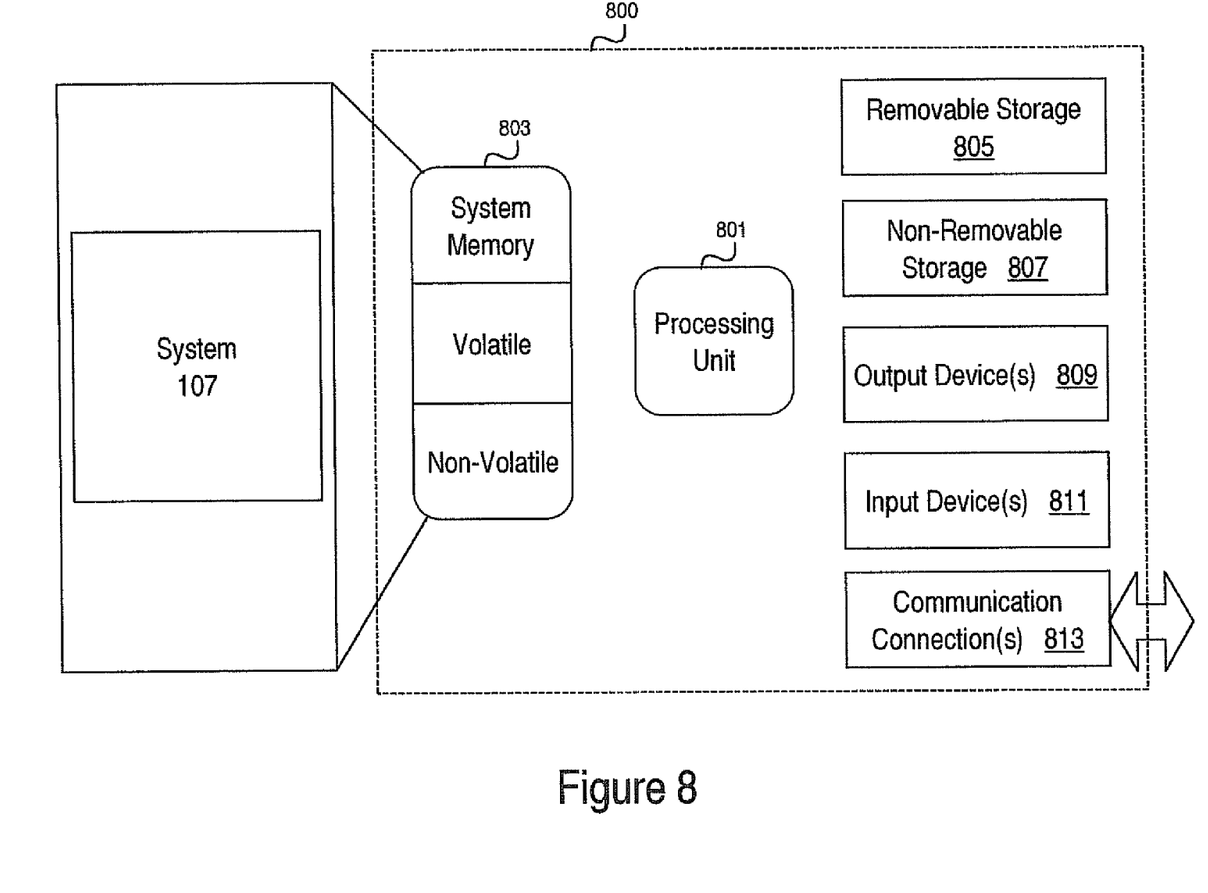
FIG. 8 shows an exemplary computing device according to one embodiment of the present invention.

Exemplary Hardware Operating Environment of System for Automated Generation of Mask for Spacer Formation from a Desired Final Wafer Pattern According to One Embodiment FIG. 8 shows an exemplary computing device 800 according to one embodiment. Referring to FIG. 8, computing device 800 typically includes at least some form of computer readable media. Computer readable media can be any available media that can be accessed by computing device 800 and can include but is not limited to computer storage media.

In its most basic configuration, computing device 800 typically includes processing unit 801 and system memory 803. Depending on the exact configuration and type of computing device 800 that is used, system memory 803 can include volatile (such as RAM) and non-volatile (such as ROM, flash memory, etc.) elements or some combination of the two. In one embodiment, as shown in FIG. 8, system 107 for automated generation of masks for spacer formation from a final pattern (see description of system made with reference to FIG. 1) can reside in system memory 803.

Additionally, computing device 800, can include mass storage systems (removable 805 and/or non-removable 807) such as magnetic or optical disks or tape. Similarly, computing device 800 can include input devices 811 and/or output devices 809 (e.g., such as a display). Additionally, computing device 800 can include network connections 813 to other devices, computers, networks, servers, etc. using either wired or wireless media. As all of these devices are well known in the art, they need not be discussed in detail.

With reference to exemplary embodiments thereof, methods and systems for generating masks for spacer formation are disclosed. As a part of a disclosed method, a predefined final wafer pattern is accessed, areas related to features in the predefined final wafer pattern are identified and a template mask is formed based on the identified areas for forming spacers on a wafer. Subsequently, a mask is formed for use in the removal of portions of the spacers to form an on wafer pattern that corresponds to the predefined final wafer pattern.

The foregoing descriptions of specific embodiments have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method for generating two mask patterns and corresponding masks for spacer formation using an indirect double patterning process, the method comprising:
   using a processor of a computer system, accessing a fixed final wafer pattern provided to the computer system;
   using a processor of a computer system, separating the fixed final wafer pattern into a first layer and a second layer,
      wherein the first layer comprises first features of the fixed final wafer pattern,
      wherein the second layer comprises second features of the fixed final wafer pattern,
      wherein the first features alternate with the second features in the fixed final wafer pattern;
   using the processor of the computer system, identifying areas in the fixed final wafer pattern,
      wherein each of the areas comprises one of the first features and one of the second features adjacent to the one of the first features,
      wherein the first features and the second features are parallel lines, and
      wherein a distance between the one of the first features and the one of the second features adjacent to the one of the first features is less than a minimum patterning space;
   generating a template mask pattern for forming spacers on a wafer,
      wherein the template mask pattern comprises the areas identified for the fixed final wafer pattern;
   forming on a wafer a plurality of spacers using a first mask having the template mask pattern,
      wherein each of the plurality of spacers comprises;
   using the processor of the computer system, generating one of a field mask pattern or a cut mask pattern based on a difference between the plurality of spacers formed on the wafer and the fixed final wafer pattern;
   forming on the wafer a second mask based on the one of the field mask pattern or the cut mask pattern; and
   removing portions of the plurality of spacers using the second mask while remaining portions of said plurality of spacers are retained as the features representing the fixed final wafer pattern.

2. The method of claim 1, wherein the areas are selected from the group consisting of lines and spaces.

3. The method of claim 1 further comprising verifying the fixed wafer pattern for compliance with minimum process design rules for line, space, proximity, and overlap.

4. The method of claim 1, wherein a distance between the one of the first features and another one of the first features adjacent to the one of the first features is greater than the minimum patterning space of forming the plurality of spacers.

5. The method of claim 1, wherein a distance between the one of the second features and another one of the second features adjacent to the one of the second features is greater than the minimum patterning space of forming the plurality of spacers.

6. The method of claim 1, wherein the areas comprises a space between the one of the first features and the one of the second features adjacent to the one of the first features.

7. An apparatus comprising:
   a computer readable memory unit; and
   a processor coupled to the memory unit,
      the processor for executing a method for generating two mask patterns and corresponding masks for spacer formation using an indirect double patterning process, the method comprising:
   using the processor, separating a fixed final wafer pattern into a first layer and a second layer,
      wherein the first layer comprises first features of the fixed final wafer pattern,
      wherein the second layer comprises second features of the fixed final wafer pattern,
      wherein the first features alternate with the second features in the fixed final wafer pattern;
   using the processor, identifying areas in the fixed final wafer pattern,
      wherein each of the areas comprises one of the first features and one of the second features adjacent to the one of the first features,
      wherein the first features and the second features are parallel lines, and
      wherein a distance between the one of the first features and the one of the second features adjacent to the one of the first features is less than a minimum patterning space;
   generating a template mask pattern for forming spacers on a wafer,
      wherein the template mask pattern comprises the areas identified for the fixed final wafer pattern;
   generating one of a field mask pattern or a cut mask pattern based on a difference between a plurality of spacers formed on the wafer and the fixed final wafer pattern.

8. The apparatus of claim 7, wherein the areas are selected from the group consisting of lines and spaces.

9. The apparatus of claim 7, wherein the method further comprising verifying the fixed wafer pattern for compliance with minimum process design rules for line, space, proximity, and overlap.

10. The apparatus of claim 7, wherein a distance between the one of the first features and another one of the first features adjacent to the one of the first features is greater than the minimum patterning space of forming the plurality of spacers.

11. The apparatus of claim 7, wherein a distance between the one of the second features and another one of the second features adjacent to the one of the second features is greater than the minimum patterning space of forming the plurality of spacers.

12. The apparatus of claim 7, wherein the areas comprises a space between the one of the first features and the one of the second features adjacent to the one of the first features.

* * * * *